(12) United States Patent
Iwata

(10) Patent No.: US 12,724,351 B2
(45) Date of Patent: Sep. 1, 2026

(54) EXPOSURE APPARATUS AND ARTICLE MANUFACTURING METHOD

(71) Applicant: CANON KABUSHIKI KAISHA, Tokyo (JP)

(72) Inventor: Shohei Iwata, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 141 days.

(21) Appl. No.: 18/489,062

(22) Filed: Oct. 18, 2023

(65) Prior Publication Data

US 2024/0134286 A1 Apr. 25, 2024
US 2024/0231238 A9 Jul. 11, 2024

(30) Foreign Application Priority Data

Oct. 25, 2022 (JP) ................................ 2022-170870

(51) Int. Cl.
*G03F 7/20* (2006.01)
*G03F 7/00* (2006.01)

(52) U.S. Cl.
CPC ...... *G03F 7/70141* (2013.01); *G03F 7/70625* (2013.01); *G03F 7/706849* (2023.05)

(58) Field of Classification Search
CPC ............ G03F 7/70141; G03F 7/70625; G03F 7/706849; G03F 9/7026; G03F 9/7034;
(Continued)

(56) References Cited

U.S. PATENT DOCUMENTS

2007/0262268 A1 11/2007 De Nivelle et al.
2008/0151204 A1 6/2008 Van De Vin et al.
(Continued)

FOREIGN PATENT DOCUMENTS

JP 2016206654 A 12/2016
KR 1020160123236 A 10/2016
(Continued)

OTHER PUBLICATIONS

Extended European search report issued in European Appln. No. 23204834.8, mailed on Mar. 26, 2024.
(Continued)

*Primary Examiner* — Mesfin T Asfaw
(74) *Attorney, Agent, or Firm* — ROSSI, KIMMS & McDOWELL LLP

(57) ABSTRACT

An exposure apparatus for exposing a plurality of shot regions on a substrate includes a projection optical system, a drive mechanism configured to drive the substrate, a detector configured to detect a surface height of the substrate, and a controller configured to control the drive mechanism based on an output of the detector. The projection optical system is configured to project a pattern of an original to an exposure region in an image plane of the projection optical system. A detection region of the detector is larger than the exposure region. The controller is configured to control, based on an output of the detector obtained when a first shot region of the plurality of shot regions is arranged in the exposure region, driving of the substrate, by the drive mechanism, for exposing a second shot region of the plurality of shot regions.

12 Claims, 6 Drawing Sheets

(58) Field of Classification Search
CPC ............. G03F 7/70591; G03F 7/70483; G03F 7/706835; G03F 7/70775
See application file for complete search history.

(56) References Cited

U.S. PATENT DOCUMENTS

2012/0013879 A1* 1/2012 Den Boef ............. G03F 9/7088 356/623
2016/0306284 A1* 10/2016 Nishimura .......... G03F 7/70641

FOREIGN PATENT DOCUMENTS

KR 20180111572 A * 10/2018 ......... G03F 7/70666
KR 1020180111572 A 10/2018

OTHER PUBLICATIONS

Office Action issued in Taiwanese Appln. No. 112139161 dated Feb. 24, 2026.

* cited by examiner

F I G. 1
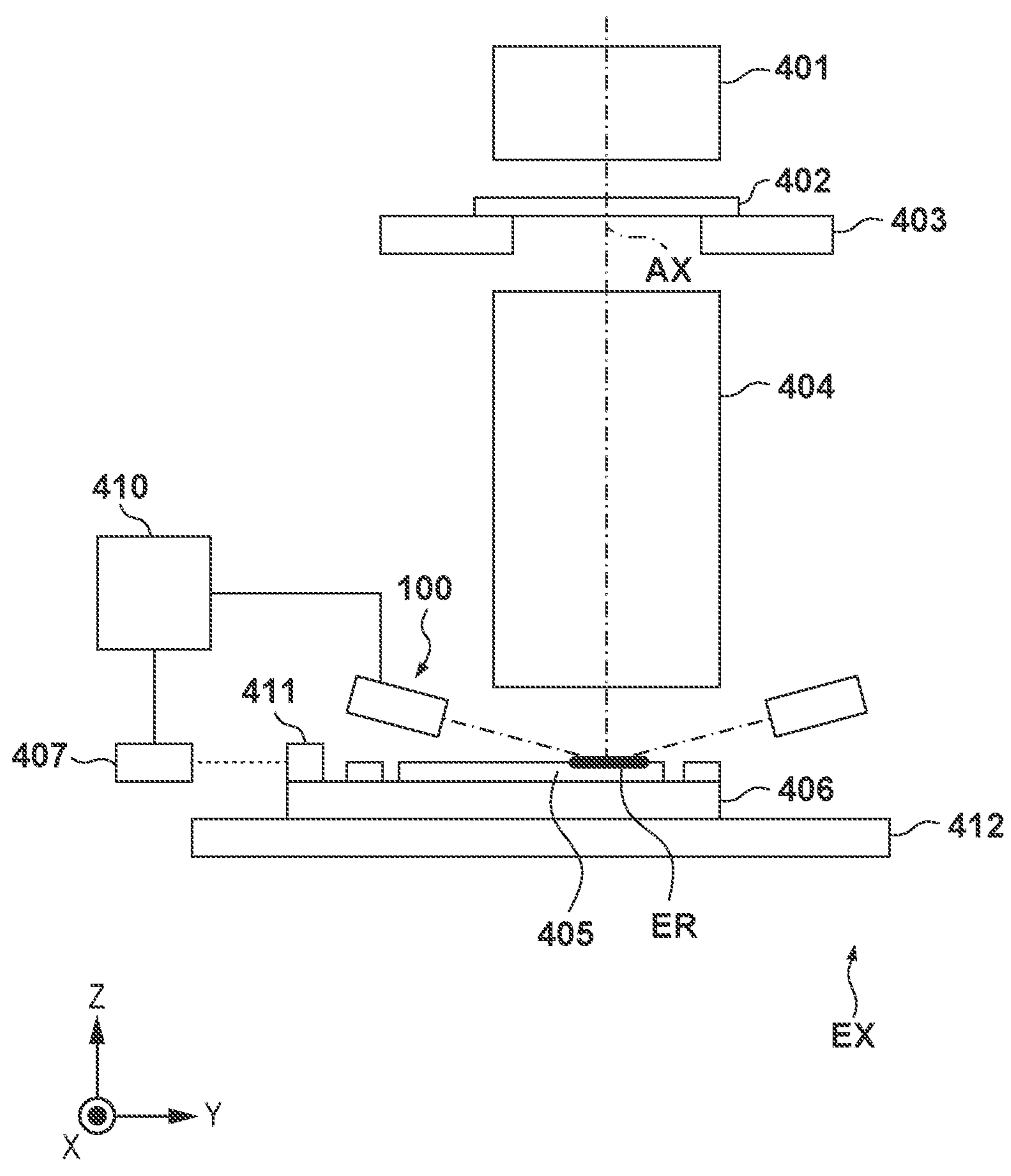

702,ER
702
703
701,ER
705
706
707

F I G. 7
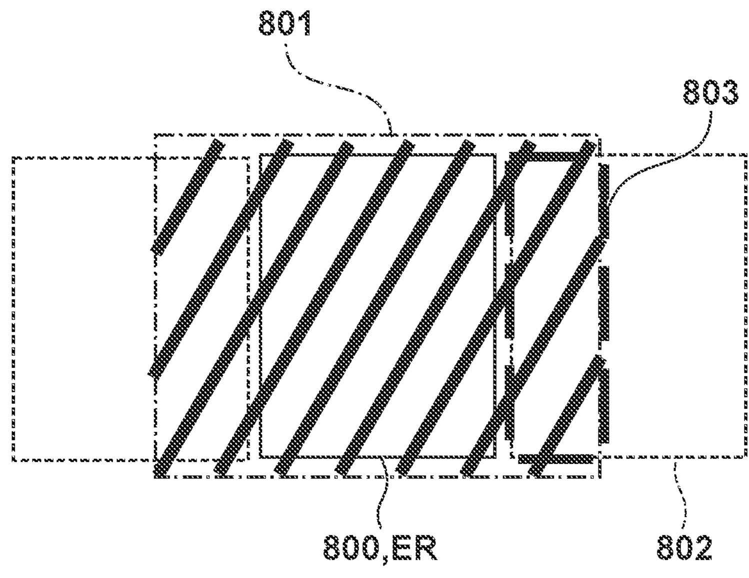

EXPOSURE APPARATUS AND ARTICLE MANUFACTURING METHOD

BACKGROUND OF THE INVENTION

Field of the Invention

The present invention relates to an exposure apparatus and an article manufacturing method.

Description of the Related Art

In an exposure apparatus, after measuring the height of a shot region on a substrate and adjusting the height of the substrate based on the measurement result, exposure on the shot region can be performed. Japanese Patent Laid-Open No. 2016-206654 describes that the heights (positions in the optical axis direction of a reduction projection lens system) of a plurality of measurement points in a shot region on a substrate are measured, and the height and tilt of the substrate are adjusted based on the measurement results.

In an exposure apparatus in which measurement of the height and the like of a shot region is started after the shot region on a substrate fits in the exposure region of a projection optical system, which is the region irradiated with light by the projection optical system during exposure, this process limits throughput.

SUMMARY OF THE INVENTION

The present invention provides a technique advantageous in improving throughput.

One of aspects of the present invention provides an exposure apparatus for exposing a plurality of shot regions on a substrate, comprising: a projection optical system; a drive mechanism configured to drive the substrate; a detector configured to detect a surface height of the substrate; and a controller configured to control the drive mechanism based on an output of the detector, wherein the projection optical system is configured to project a pattern of an original to an exposure region in an image plane of the projection optical system, a detection region of the detector is larger than the exposure region, and the controller is configured to control, based on an output of the detector obtained when a first shot region of the plurality of shot regions is arranged in the exposure region, driving of the substrate, by the drive mechanism, for exposing a second shot region of the plurality of shot regions.

Further features of the present invention will become apparent from the following description of exemplary embodiments with reference to the attached drawings.

BRIEF DESCRIPTION OF THE DRAWINGS

FIG. 1 is a view schematically showing an arrangement example of an exposure apparatus according to an embodiment of the present disclosure;

FIG. 7 is a view for explaining the operation of the third modification.

DESCRIPTION OF THE EMBODIMENTS

Figure 2:
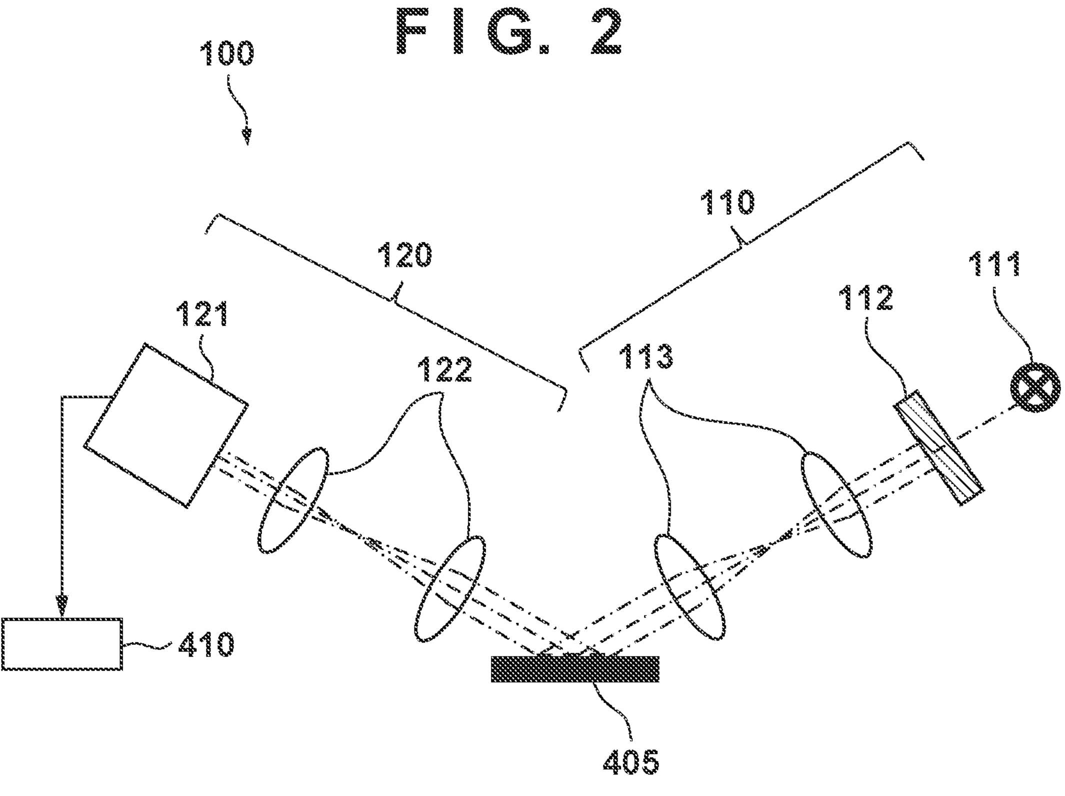
FIG. 2 is a view showing an arrangement example of a detector.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 schematically shows an arrangement example of an exposure apparatus EX according to an embodiment of the present disclosure. The exposure apparatus EX can be configured to expose a plurality of shot regions on a substrate 405. The exposure apparatus EX can include a projection optical system 404, a drive mechanism (substrate drive mechanism) 412 that drives the substrate 405, a detector 100 that detects the surface height of the substrate 405, and a controller 410 that controls the drive mechanism 412 based on the output of the detector 100. The projection optical system 404 can be configured to project the pattern of an original 402 to an exposure region ER in the image plane of the projection optical system 404. The exposure region ER is a region irradiated with exposure light by the projection optical system 404. In a case of the exposure apparatus EX formed as a stepper, when the shot region on the substrate 405 is arranged in the exposure region ER, the range of the shot region can be coincident with the range of the exposure region ER. In a case of the exposure apparatus EX formed as a scanner, the exposure region ER is a slit-like region, and the shot region on the substrate 405 is exposed when the substrate 405 is scanned with respect to the exposure region ER. A detection region, which is the visual field of the detector 100, is larger than the exposure region ER.

The controller 410 can control, based on the output of the detector 100 obtained when the first shot region of a plurality of shot regions on the substrate 405 is arranged in the exposure region ER, driving of the substrate by the drive mechanism 412 for exposing the second shot region of the plurality of shot regions. Note that expressions “first shot region” and “second shot region” are merely terms for distinguishing different shot regions from each other. The controller 410 can control, based on the output of the detector 100 obtained when the first shot region is arranged in the exposure region ER, driving of the substrate 405 by the drive mechanism 412 when moving the second shot region to the exposure region ER. Here, driving of the substrate can include driving for making the second shot region (surface thereof) coincident with the image plane of the projection optical system 404 (driving of the substrate in a direction parallel to the optical axis of the projection optical system 404).

For example, the controller 410 can control, based on the output of the detector 100 obtained when the first shot region is exposed in the exposure region ER, driving of the substrate 405 by the drive mechanism 412 for moving the second shot region to the exposure region ER. Alternatively, the controller 410 can control, based on the output of the detector 100 obtained in a period from arrangement of the first shot region in the exposure region ER to exposure of the first shot region, driving of the substrate by the drive mechanism 412 for moving the second shot region to the exposure region ER.

The controller 410 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. The exposure apparatus EX may include a substrate stage 406 including a substrate chuck for holding the substrate 405. The drive mechanism 412 can drive the substrate 405 by driving the substrate stage 406.

In this specification and the drawings, directions are specified on an XYZ coordinate system. An optical axis AX of the projection optical system 404 is parallel to the Z-axis. The optical axis AX and the Z-axis are typically parallel to the vertical direction. The substrate 405 can be driven and positioned by the drive mechanism 412 with respect to six axes of the X-, Y-, and Z-axes, a rotation about the X-axis (OX), a rotation about the Y-axis (OY), and a rotation about the Z-axis (OZ). The exposure apparatus EX can include a measurement device 407 used to measure the position and posture of the substrate stage 406. The measurement device 407 is, for example, a laser interferometer. The measurement device 407 can be configured to apply a laser beam to a reflector 411 provided on the substrate stage 406, and detect the displacement of the substrate stage 406 using the laser beam reflected by the reflector 411.

The exposure apparatus EX can further include an illumination optical system 401 that illuminates the original 402, and an original drive mechanism 403 that drives the original 402. The illumination optical system 401 can uniformly illuminate the original 402 using exposure light emitted from a light source (not shown). For the exposure light, for example, an ultra-high pressure mercury lamp (g-ray lamp or i-ray lamp), a KrF excimer laser, an ArF excimer laser, an F2 laser, or the like can be used. Alternatively, to manufacture a smaller semiconductor device, extreme ultraviolet light (EUV light) having a wavelength of several nm to several hundred nm may be used as the exposure light.

The controller 410 can control the drive mechanism 412 based on the output of the detector 100 so as to make the shot region (more specifically, for example, the surface of the shot region) to be exposed on the substrate 405 coincident with the image plane of the projection optical system 404. This control can include control of the surface height (position in the Z-axis direction) and tilt (OX and OY) of the substrate 405. The controller 410 may also control the optical element of the projection optical system 404 so as to make the shot region to be exposed on the substrate 405 coincident with the image plane of the projection optical system 404.

FIG. 2 shows an arrangement example of the detector 100. The detector 100 can include a projecting unit 110 and a light receiving unit 120. The projecting unit 110 can be configured to obliquely project the pattern to the surface of the substrate 405 serving as a subject. The projecting unit 110 can include, for example, a light source 111, a pattern portion 112 including two-dimensionally arrayed patterns, and a projecting optical system 113 that projects the patterns of the pattern portion 112 to the substrate 405. Note that the projecting optical system 113 need not be provided depending on the kind of the light source 111 and the distance between the pattern portion 112 and the substrate 405.

Figure 3:
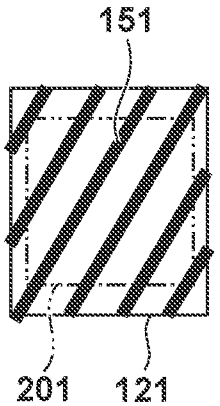
FIG. 3 is a view exemplarily showing the geometric relationship among an image sensor, a detection region, and a pattern image.

The light receiving unit 120 can include an image sensor 121, and an imaging optical system 122 that forms, on the image sensor 121, the image of the pattern projected to the substrate 405 by the projecting unit 110. FIG. 3 exemplarily shows the image sensor 121, a detection region 201, and a pattern image 151 formed on the image sensing surface of the image sensor 121 by the imaging optical system 122. The detection region 201 is the visual field of the detector 100, and larger than the exposure region ER. By processing the image captured in the detection region 201, the controller 410 can acquire the height or height distribution of the region corresponding to the detection region 201 in the entire surface of the substrate 405.

If the surface height of the substrate 405 serving as the subject fluctuates, the patten image 151 fluctuates accordingly. The controller 410 can acquire the surface height of the substrate 405 based on the fluctuation of the pattern image 151 captured by the image sensor 121. By processing the image of an arbitrary region in the detection region 201 of the image sensor 121 (corresponding to an arbitrary region of the surface of the substrate 405), the controller 410 can detect the height of the arbitrary region of the surface of the substrate 405. The image sensor 121 can be formed from, for example, a CMOS image sensor, a CCD image sensor, a photodiode array, or the like.

The pattern portion 112 and the surface of the substrate 405 may be set in the relationship of a Scheimpflug optical system using the projecting optical system 113. The relationship of the Scheimpflug optical system makes it possible to focus the entire region of the pattern portion 112 on the substrate 405, and measurement accuracy can be improved. Further, the Scheimpflug optical system makes it possible to match the main direction defining the exposure order in the exposure apparatus EX with the projection direction of the pattern portion 112. With this, the pattern image to be captured by the image sensor 121 is reduced, so that it is possible to set the detection region 201 so as to include the adjacent shot region to be exposed next. In the example shown in the drawings, the main direction is the Y-axis direction. Normally, the exposure apparatus EX sequentially exposes multiple shot regions arranged in the main direction, and then sequentially exposes multiple shot regions arranged in the adjacent row.

Figure 4:
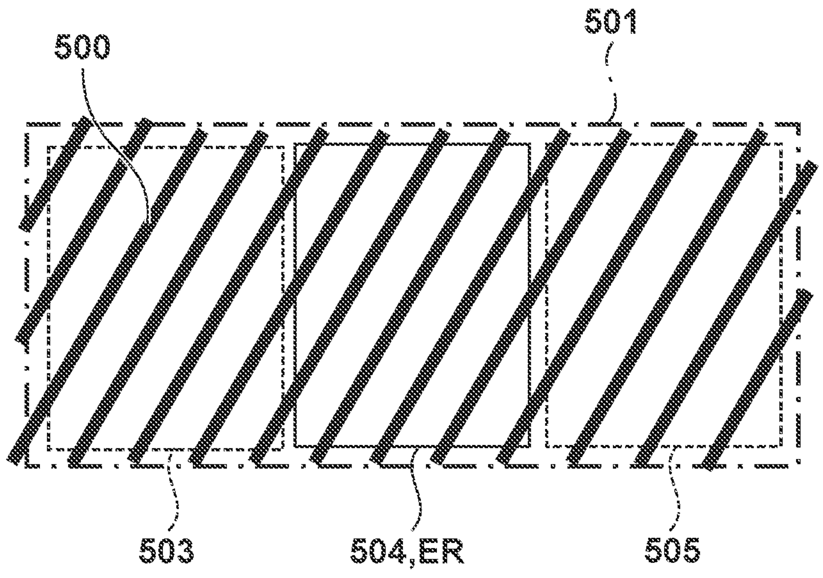
FIG. 4 is a view for exemplarily explaining the operation according to the embodiment.

FIG. 4 exemplarily shows a detection region 501 (corresponding to the detection region 201 described above), a pattern image 500 (corresponding to the pattern image 151 described above), and shot regions 503, 504, and 505 in the embodiment. The shot regions 503, 504, and 505 show an example of multiple shot regions along the main direction.

When the first shot region 504 is arranged in the exposure region ER, the detector 100 can be controlled to capture and output the image of the second shot region 503 or 505 adjacent to the first shot region 504. The second shot region 503 or 505 can be the shot region to be exposed next to the first shot region 504, or the shot region to be exposed after exposure of the first shot region 504. The controller 410 can control, based on the output of the detector 100 obtained when the first shot region 504 is arranged in the exposure region ER, driving of the substrate 405 by the drive mechanism 412 for exposing the second shot region 503 or 505. Alternatively, the controller 410 can control, based on the output of the detector 100 obtained when the first shot region 504 is arranged in the exposure region ER, driving of the substrate 405 by the drive mechanism 412 for moving the second shot region 503 or 505 to the exposure region ER.

In another point of view, the controller 410 can control, based on the output of the detector 100 obtained when the first shot region 504 is exposed in the exposure region ER, driving of the substrate 405 by the drive mechanism 412 for exposing the second shot region 503 or 505. Alternatively, the controller 410 can control, based on the output of the detector 100 obtained when the first shot region 504 is exposed in the exposure region ER, driving of the substrate 405 by the drive mechanism 412 for moving the second shot region 503 or 505 to the exposure region ER.

In still another point of view, the controller 410 can control, based on the output of the detector 100 obtained in a period from arrangement of the first shot region 504 in the exposure region ER to exposure of the first shot region 504, driving of the substrate 405 by the drive mechanism 412 for exposing the second shot region 503 or 505. Alternatively, the controller 410 can control, based on the output of the detector 100 obtained in a period from arrangement of the first shot region 504 in the exposure region ER to exposure of the first shot region 504, driving of the substrate 405 by the drive mechanism 412 for moving the second shot region 503 or 505 to the exposure region ER.

In the state in which the first shot region is arranged in the exposure region ER, the entire second shot region preferably fits in the detection region 501, but only a part of the second shot region may fit in the detection region 501. In this case, the height or height distribution of the part of the second shot region is detected using the detector 100, and the controller 410 can control, based on the detection result, driving of the substrate 405 by the drive mechanism 412 for exposing the second shot region.

In an example, the height or height distribution of the second shot region 503 is detected using the detector 100 in the state in which the first shot region 504 is arranged in the exposure region ER. Then, after the first shot region 504 is exposed, the controller 410 can control the drive mechanism 412 based on the detection result so as to make the surface of the second shot region 503 coincident with the image plane of the projection optical system 404 while positioning the second shot region 503 in the exposure region ER. With this, it is possible to shorten the time required until exposure of the second shot region 503 can be started after the exposure of the first shot region 504, so that throughput can be improved.

Figure 5:
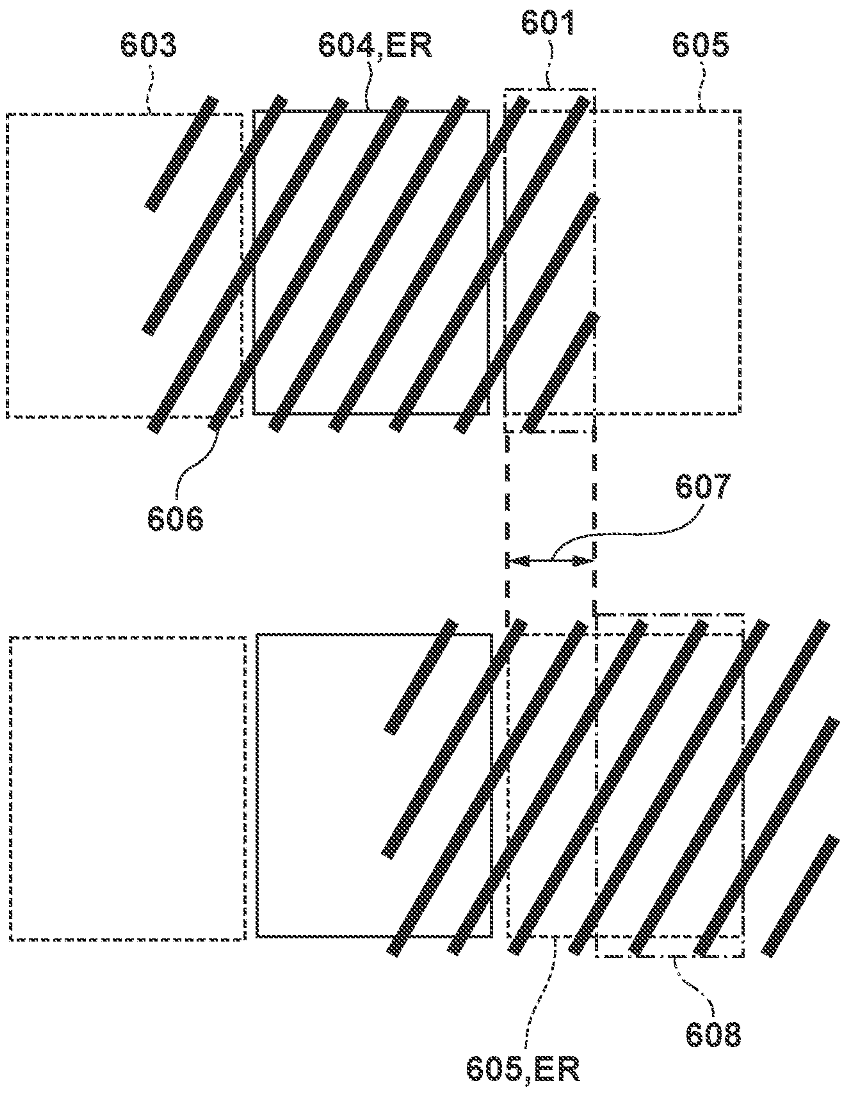
FIG. 5 is a view for explaining the operation of the first modification.

With reference to FIG. 5, the first modification will be described. In the first modification, the controller 410 detects the height of a first portion 601 of a second shot region 605 on the substrate 405 based on the output of the detector 100 obtained when a first shot region 604 on the substrate 405 is arranged in the exposure region ER. After moving the second shot region 605 to the exposure region ER, the controller 410 detects the height of a second portion 608 of the second shot region 605 based on the output of the detector 100. Then, the controller 410 controls, based on the height of the first portion 601 and the height of the second portion 608, driving of the substrate 405 by the drive mechanism 412 so as to make the second shot region 605 (surface thereof) coincident with the image plane of the projection optical system 404. Here, the second portion 608 can be a portion obtained by excluding an exclusion region 607 corresponding to the first portion 601 from the entire second shot region 605. The exclusion region 607 may be the same as the first portion 601, or may be smaller than the first portion 601 so that the first portion 601 and the second portion 608 partially overlap.

According to the first modification, as compared to a conventional method, it is possible to reduce, by the amount corresponding to the exposure region 607, the amount of data processing required to detect the height of the second shot region 605 after the second shot region 605 is moved to the exposure region ER. The data processing can include, for example, data transfer from the detector 100 to the controller 410 and calculation in the controller 410. Thus, throughput can be improved as compared to the conventional method.

Figure 6:
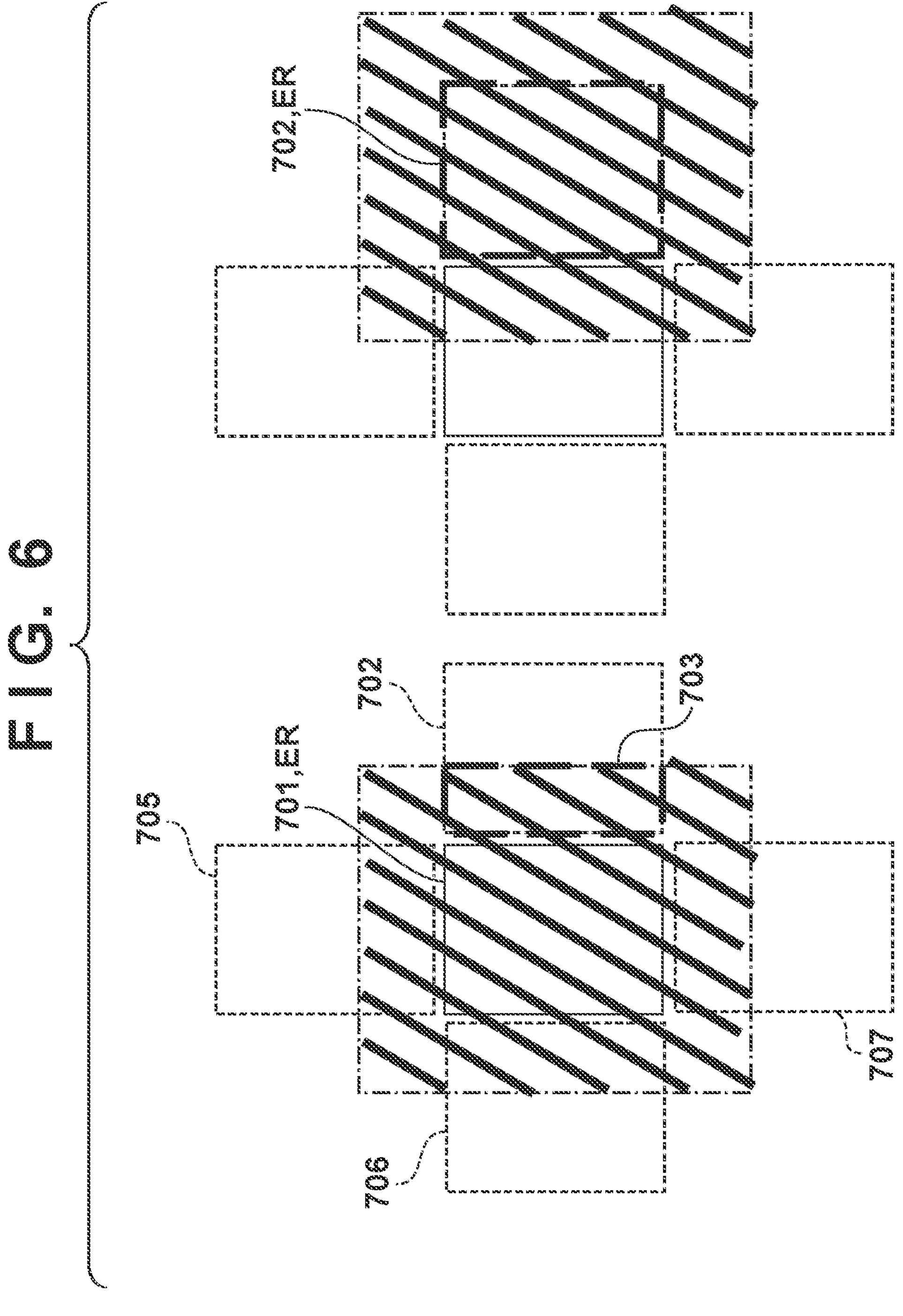
FIG. 6 is a view for explaining the operation of the second modification.

With reference to FIG. 6, the second modification will be described. The controller 410 detects, based on the output of the detector 100 obtained when a first shot region 701 is arranged in the exposure region ER, the height of a first portion 703, which is a part of a second shot region 702, as the first height. Here, the second shot region 702 can be the shot region, among shot regions 702, 705, 706, and 707 adjacent to the shot region 701, to be exposed next to the shot region 701. After the second shot region 702 is moved to the exposure region ER, the controller 410 detects, based on the output of the detector 100, the height of the entire second shot region 702 as the second height. Further, the controller 410 stores the difference between the first height and the second height as an offset.

When moving the second shot region of a plurality of shot regions on another substrate corresponding to the second shot region 702 to the exposure region ER, the controller 410 controls driving of the substrate by the drive mechanism 412 based on the height of the first portion of the second shot region on the other substrate and the difference. For example, when moving the second shot region on the other substrate to the exposure region ER, the controller 410 can make the second shot region on the other substrate coincident with the image plane of the projection optical system 404 based on the value obtained by correcting the height of the first portion of the second shot region on the other substrate using the difference.

The difference (offset) can be measured when, for example, processing at least one leading substrate of a lot. For subsequent substrates, the height of the first portion as a part of the second shot region may be obtained based on the output of the detector 100 obtained when the first shot region is arranged in the exposure region ER. Then, when moving the second shot region to the exposure region ER, the controller 410 can control driving of the substrate 405 by the drive mechanism 412 based on the height of the first portion of the second shot region and the difference. Thus, the second modification is advantageous in improving focus accuracy and improving throughput.

With reference to FIG. 7, the third modification will be described. A first shot region 800 and a first portion 803 as a part of a second shot region 802 can fit in a detection region 801 of the detector 100. The controller 410 detects the height of the first portion 803 of the second shot region 802 based on the output of the detector 100 obtained when the first shot region 800 on the substrate 405 is arranged in the exposure region ER. When moving the second shot region 802 to the exposure region ER, the controller 410 can control the drive mechanism 412 based on the height of the first portion 803, and the height difference between the first shot region 800 and the second shot region 802 obtained based on information registered in advance. This control can be performed to make the second shot region 802 coincident with the image plane of the projection optical system 404. The height difference can be acquired using at least one leading substrate of a lot.

As a method of controlling driving of the substrate based on the height (a) of the first portion 803 and the height difference (b) between the shot region 800 and the region 802, various methods can be applied. For example, a method is effective in which the weighting on the height (a) of the first portion 803 and the weighting on the height difference (b) are decided based on the actual exposure result, and driving of the substrate is controlled based on the weighted average of the height (a) of the first portion 803 and the height difference (b).

Next, an article manufacturing method of manufacturing an article (a semiconductor IC element, liquid crystal display element, MEMS, or the like) by using the above exposure apparatus will be described. An article is manufactured by using the above exposure apparatus through a step of exposing a substrate (a wafer, glass substrate, or the like) coated with a photosensitizing agent, a step of developing the substrate (photosensitizing agent), and processing the developed substrate in other known steps. Other known steps include etching, resist removal, dicing, bonding, and packaging. This article manufacturing method can manufacture an article with higher quality than a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-170870, filed Oct. 25, 2022, which is hereby incorporated by reference herein in its entirety.

What is claimed is:

1. An exposure apparatus for exposing a plurality of shot regions on a substrate, comprising:

a projection optical system;

a drive mechanism configured to drive the substrate;

a detector configured to detect a surface height of the substrate; and a controller configured to control the drive mechanism based on an output of the detector, wherein the projection optical system is configured to project a pattern of an original to an exposure region in an image plane of the projection optical system, a detection region of the detector is larger than the exposure region, and the controller is configured to control, based on an output of the detector obtained when (i) a first shot region of the plurality of shot regions is arranged in the exposure region and (ii) the first shot region and at least a part of a second shot region of the plurality of shot regions are arranged in the detection region, driving of the substrate, by the drive mechanism, for exposing the second shot region.

2. The apparatus according to claim 1, wherein the controller is configured to control, based on the output of the detector obtained when the first shot region is arranged in the exposure region, driving of the substrate, by the drive mechanism, for moving the second shot region to the exposure region.

3. The apparatus according to claim 1, wherein the controller is configured to control, based on an output of the detector obtained when the first shot region is exposed in the exposure region, driving of the substrate, by the drive mechanism, for moving the second shot region to the exposure region.

4. The apparatus according to claim 1, wherein the controller is configured to control, based on an output of the detector obtained in a period from arrangement of the first shot region in the exposure region to exposure of the first shot region, driving of the substrate, by the drive mechanism, for moving the second shot region to the exposure region.

5. The apparatus according to claim 1, wherein the second shot region is the shot region to be exposed next to the first shot region.

6. The apparatus according to claim 1, wherein the controller is configured to control, based on the output of the detector obtained when the first shot region is arranged in the exposure region, driving of the substrate by the drive mechanism with respect to an optical axis direction of the projection optical system to move the second shot region to the exposure region.

7. The apparatus according to claim 1, wherein the controller is configured to detect a height of the at least the part of the second shot region based on the output of the detector obtained when (i) the first shot region is arranged in the exposure region and (ii) the first shot region and the at least the part of the second shot region are arranged in the detection region, and the controller is configured to control driving of the substrate by the drive mechanism based on the height of the at least the part of the second shot region to move the second shot region to the exposure region.

8. The apparatus according to claim 1, wherein the controller is configured to detect a height of the at least the part of the second shot region based on the output of the detector obtained when (i) the first shot region is arranged in the exposure region and (ii) the first shot region and the at least the part of the second shot region are arranged in the detection region, and after the second shot region is moved to the exposure region, the controller detects a height of a second part of the second shot region based on an output of the detector, and controls driving of the substrate by the drive mechanism based on the height of the at least the part of the second shot region and the height of the second part of the second shot region.

9. The apparatus according to claim 1, wherein the controller is configured to detect, based on the output of the detector obtained when the first shot region is arranged in the exposure region, a height of the at least the part of the second shot region as a first height, after the second shot region is moved to the exposure region, the controller detects, based on an output of the detector, a height of the entire second shot region as a second height, the controller is configured to store a difference between the first height and the second height, and in order to move a second shot region of a plurality of shot regions on another substrate corresponding to the second shot region on the substrate to the exposure region, the controller is configured to control driving of the substrate by the drive mechanism based on a height of a at least the part of the second shot region of the second shot region on the other substrate and the difference.

10. The apparatus according to claim 1, wherein the controller is configured to detect a height of the at least the part of the second shot region based on the output of the detector obtained when (i) the first shot region is arranged in the exposure region and (ii) the first shot region and the at least the part of the second shot region are arranged in the detection region, and in order to move the second shot region to the exposure region, the controller is configured to control driving of the substrate by the drive mechanism based on the height of the at least the part of the second shot region, and a height difference between the first shot region and the second shot region obtained based on information registered in advance.

11. The apparatus according to claim 10, wherein the height difference is acquired using at least one leading substrate of a lot.

12. An article manufacturing method comprising:

exposing a substrate by an exposure apparatus for exposing a plurality of shot regions on the substrate;

developing the substrate having undergone the exposing; and obtaining an article by processing the substrate having undergone the developing, wherein the exposure apparatus comprises a projection optical system, a drive mechanism configured to drive the substrate, a detector configured to detect a surface height of the substrate, and a controller configured to control the drive mechanism based on an output of the detector, wherein the projection optical system is configured to project a pattern of an original to an exposure region in an image plane of the projection optical system, a detection region of the detector is larger than the exposure region, and the controller is configured to control, based on an output of the detector obtained when (i) a first shot region of the plurality of shot regions is arranged in the exposure region and (ii) the first shot region and at least a part of a second shot region of the plurality of shot regions are arranged in the detection region, driving of the substrate, by the drive mechanism, for exposing the second shot region.

* * * * *